(12) United States Patent
Hung et al.

(10) Patent No.: US 7,577,019 B2
(45) Date of Patent: Aug. 18, 2009

(54) MAGNETIC MEMORY CELL WITH MULTIPLE-BIT IN STACKED STRUCTURE AND MAGNETIC MEMORY DEVICE

(75) Inventors: Chien-Chung Hung, Taipei (TW);
Ming-Jer Kao, Hsinchu County (TW);
Yuan-Jen Lee, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/853,818

(22) Filed: Sep. 12, 2007

(65) Prior Publication Data
US 2008/0298119 A1    Dec. 4, 2008

(30) Foreign Application Priority Data
May 30, 2007    (TW) .............................. 96119286 A

(51) Int. Cl.
G11C 11/00    (2006.01)
(52) U.S. Cl. ................... 365/158; 365/171; 365/173; 977/935
(58) Field of Classification Search .............. 365/158, 365/66, 78, 80, 83, 85, 100, 171, 173, 225.5, 365/243.5; 257/421, E21.665; 977/933, 977/934, 935
See application file for complete search history.

(56) References Cited

U.S. PATENT DOCUMENTS

| | | |
|---|---|---|
| 6,545,906 B1 | 4/2003 | Savtchenko et al. |
| 6,757,189 B2 | 6/2004 | Hung et al. |
| 6,882,566 B2 | 4/2005 | Nejad et al. |
| 2003/0117834 A1* | 6/2003 | Iwata et al. .................. 365/158 |
| 2007/0171704 A1 | 7/2007 | Hung et al. |

* cited by examiner

*Primary Examiner*—Son Dinh
*Assistant Examiner*—Harry W Byrne
(74) *Attorney, Agent, or Firm*—Jianq Chyun IP Office

(57) ABSTRACT

A multi-bit magnetic memory cell in a stacked structure controlled by at least one read bit line and one read word line is provided. The multi-bit magnetic memory cell includes at least two magnetic memory units and a switching device. Each magnetic memory unit has a magneto-resistance value and at least the two magnetic memory units are stacked to form a circuit of serial connection or parallel connection. The circuit and the read bit line are connected. The switching device is connected to the circuit, wherein the switching device is controlled by the read word line to be conducting or non-conducting so as to connect the circuit with a ground voltage. Furthermore, a plurality of the multi-bit magnetic cells is used to form a magnetic memory device.

14 Claims, 14 Drawing Sheets

US 7,577,019 B2

MAGNETIC MEMORY CELL WITH MULTIPLE-BIT IN STACKED STRUCTURE AND MAGNETIC MEMORY DEVICE

CROSS-REFERENCE TO RELATED APPLICATION

This application claims the priority benefit of Taiwan application serial no. 96119286, filed May 30, 2007. All disclosure of the Taiwan application is incorporated herein by reference.

BACKGROUND OF THE INVENTION

1. Field of the Invention

The present invention generally relates to a magnetic memory cell, and more particularly, to a multi-bit magnetic memory cell in a stacked structure and magnetic memory device using the same.

2. Description of Related Art

Magnetic memory, for example, Magnetic Random Access Memory (MRAM) has at least the advantages of non-volatile data storage, high storage density, high read/write speed and radiation resistant. Magnetic memory utilizes the magnetization of magnetic material adjacent to a tunnel barrier layer. The magnitude of magnetic resistance produced by a parallel and an anti-parallel arrangement can be used to record a data value of '0' or '1' in a memory cell. The conventional method of writing data into a memory cell includes using two current lines, for example, a Bit Line (BL) and a Write Word Line (WWL), to sense the memory cell of the magnetic memory selected by the crossover of magnetic fields. At the same time, changing the direction of magnetization of a free layer also changes the magneto-resistance value. To read data from the magnetic memory, a current is allowed to flow into the selected magnetic memory cell and the digital value of the memory data can be determined according to the reading of the magneto-resistance value.

FIG. 1 is a diagram showing the basic structure of a conventional magnetic memory cell. As shown in FIG. 1, accessing a magnetic memory cell needs a pair of crossover current lines 100 and 102 and each of the current lines 100 and 102 must be provided with a suitable current. According to the mode of operation, the current lines 100 and 102 are called a write word line and a write bit line, respectively. After currents are passed into the two conducting lines, magnetic fields in two directions are produced so that a magnetic field of the required magnitude and direction can be applied to the magnetic memory cell 104. The magnetic memory cell 104 has a stacked structure and includes a magnetic pinned layer having a fixed magnetization or total magnetic moment in a predetermined direction. The magnitude of the magnetic resistance can be used to determine the data. Furthermore, through the output electrodes 106 and 108, the data stored in the memory cell can be read. Since those skilled in the art should understand the details of operation of the magnetic memory, further description is omitted.

FIG. 2 shows a memory mechanism of a magnetic memory. As shown in FIG. 2, magnetic pinned layer 104a has a fixed magnetic moment direction 107. The free magnetic layer 104c is located above the magnetic pinned layer 104a and a barrier layer 104a in the middle isolates the two layers. This barrier layer 104b is also called a 'tunnel barrier layer'. The free magnetic layer 104c has a magnetic moment direction 108a or 108b. Because the magnetic moment direction 107 is in parallel to the magnetic moment direction 108a, the generated magnetic resistance represents the data bit '0', for example. Conversely, if the magnetic moment direction 107 is anti-parallel to the magnetic moment direction 108b, the generated magnetic resistance represents the data bit '1', for example.

In general, when the free magnetic layer 104c is a single layer as shown in FIG. 2, the chance of having an accessing error is high. To resolve the problem and minimize the interference on adjacent memory cells when writing data, the conventional technique replaces the free magnetic layer with a single layer of ferromagnetic material by a ferromagnetic (FM)/non-magnetic metal (M)/ferromagnetic (FM) three-layered structure to form a stacked free magnetic layer 166. The stacked free magnetic layer 166 is shown in FIG. 3. The ferromagnetic metal layers 150 and 154 are disposed above and below the non-magnetic metal layer 152, respectively. The ferromagnetic metal layer 150 and the ferromagnetic metal layer 154 have an anti-parallel arrangement to form enclosed magnetic lines. The stacked magnetic pinned layer 168 below the stacked free magnetic layer 166 is isolated from the stacked free magnetic layer 166 by the tunnel barrier layer (T) 156. The stacked magnetic pinned layer 168 includes a top pinned layer (TP) 158, a non-magnetic metal layer 160 and a bottom pinned layer (BP) 162. Both the TP 158 and the BP 162 have a fixed magnetization. Furthermore, a base layer 164, for example, an anti-ferromagnetic layer, is disposed at the bottom.

For the stacked free magnetic layer 166 with three-layered structure, the Write Bit Line (WBL) and the Write Word Line (WWL) are disposed at 45° angle with respect to the magnetic anisotropic axis of the stacked free magnetic layer 166. The direction of the magnetic anisotropic axis is the so-called 'easy axis direction'. Therefore, a magnetic field at 45° angle with respect to the easy axis can be respectively applied by the Write Bit Line (WBL) and the Write Word Line (WWL) according to a sequential relationship so as to rotate the magnetization of the stacked free magnetic layer 166. The directions of magnetization of the ferromagnetic metal layer 154 and the top pinned layer 158 also determine the data stored in the memory cell.

In addition to changing the single free layer to a three-layered structure, the conventional technique also provides a toggle mode of operation for rotating the magnetization of the free layer. Because the toggle mode operates by repeatedly switching between the bi-stable states '0' and '1', it is also called a bi-state mode. FIG. 4 is a diagram showing the effects of applying an external magnetic field on the three-layered structure. As shown in FIG. 4, the thick arrow represents an externally applied magnetic field. The length of the arrow represents the magnitude of the magnetic field. The two narrow arrows represent the magnetization direction of the top and bottom ferromagnetic layer of the stacked free layer. When the external magnetic field is too small, the two directions of magnetization remain unchanged. When the external magnetic field is increased beyond a threshold, the two directions of magnetization form an extension angle. When the external magnetic field is too large, the two directions of magnetization follow the direction of the external magnetic field. The operating point of the toggle mode belongs to the aforementioned second condition.

FIG. 5 is a timing diagram of external magnetic fields in the toggle mode. As shown in FIG. 5, $H_1$ and $H_2$ represent two external magnetic field directions at 45° angle with respect to the easy axis and the two arrows within the ellipse represent the two directions of the magnetization. In the time period t0, no external magnetic field is applied so that the two directions of magnetization are on the easy axis. Next, the magnetic fields $H_1$ and $H_2$ are enabled according to the timing in the diagram so as to obtain total magnetic field at different time periods ($t_1$-$t_3$) and rotate the two directions of magnetization. In the time period $t_4$, no magnetic field is applied and the two directions of the magnetization are flipped over. In other words, the data stored in the memory cell is changed due to the writing.

In addition, the writing current is still high under the operating conditions of the toggle mode. Therefore, the conventional technique also provides the additional design of a bias magnetic field. FIG. 6 is a diagram showing the conventional technique of reducing the operating current. As shown by the diagram on the left side of FIG. 6, the basic structure of the memory cell is still similar to the one in FIG. 3. The main difference is that the total magnetic moment of the bottom pinned layer 162 is increased relative to the total magnetic moment of the top pinned layer 158, for example, by having a greater thickness. Due to an imbalance between the magnetic moment of the bottom pinned layer 162 and the top pinned layer 158, a stray magnetic field is produced. The stray magnetic field produces a bias field 184 on the stacked free magnetic layer 166 that can shift the toggle operating area of the first quadrant limit toward the zero point of the magnetic field, and as a result, is shortened to a distance 186. Therefore, since the required writing magnetic field is reduced, the current for producing a magnetic field in a write operation is also reduced.

In the above design, regardless of whether the operation is in the direct area or the toggle area (also called a binary state area), each memory cell has single bit storage capacity. Therefore, the conventional technique also provides a two-bit memory cell to increase memory storage capacity. FIG. 7 shows the circuit structure of conventional two-bit memory cells connected in parallel. As shown in FIG. 7, a two-bit memory cell includes two magnetic memory units 1100 and 1102 with each unit having a different magneto-resistance. Because the magneto-resistance of each magnetic memory unit has a largest and a smallest value, four different states can be assembled to achieve a two-bit memory storage capacity per cell. By controlling the measurement of the total magnetic resistance of the magnetic memory units 1100 and 1102 in parallel connection through a read bit line (RBL), for example, RBL01 and a read word line (RWL), for example, RWL1, the sense amplifier SA 1106 can read the total magnetic resistance when the transistor 1104 is conducting. After comparing the total magnetic resistance with a reference signal, the stored data D0 and D1 in the memory units are obtained. To write data into the memory units in the toggle operating mode, a write word line WWL1 and two write bit lines (WBL0, WBL1) are used as a group to control the magnetic memory units 1100 and 1102. The details of the operation are not described here.

FIG. 8 is a diagram showing the mechanism of a conventional two-bit magnetic memory cell. As shown in FIG. 8, for a two-bit magnetic memory cell operating in the toggle mode as shown in FIG. 7, the magnetic memory unit 1100 has a larger area for obtaining a smaller magneto-resistance value and the magnetic memory unit 1102 has a smaller area for obtaining a larger magneto-resistance value, for example. Because of the toggle mode of operation, the easy axis direction (the double arrow direction) is offset from the write bit line and the write word line by 45°.

FIG. 9 is a circuit diagram of a conventional two-bit magnetic memory cell. As shown in FIG. 9, with respect to the structure in FIG. 8, the magneto-resistance of the memory unit 1100 is R1 and the magneto-resistance of the memory unit 1102 is R2, and the resistance R1 and R2 are connected in parallel.

Because the foregoing two-bit magnetic memory cell design still has a horizontally stretch-out structure formed by using the area of the memory units. When the density of the memory cells is increased, this design occupies a larger usable surface area than other designs with the same memory capacity so that the potential for increasing the storage capacity is severely restricted.

SUMMARY OF THE INVENTION

Accordingly, the present invention provides a multi-bit magnetic memory cell in a stacked structure and a memory device using the same that can effectively utilizes the vertical dimension so as to attain a higher storage capacity.

According to an embodiment of the present invention, a multi-bit magnetic memory cell in a stacked structure controlled by at least one read bit line and one read word line is provided. The multi-bit magnetic memory cell includes at least two magnetic memory units and a switching device. Each magnetic memory unit has a magneto-resistance value and at least the two magnetic memory units are stacked to form a circuit of serial connection or parallel connection. The circuit and the read bit line are connected. The switching device is connected to the circuit, wherein the switching device is controlled by the read word line to be conducting or non-conducting so as to connect the circuit with a ground voltage.

The present invention also provides a magnetic memory device controlled by a write word line, a top write bit line and a bottom write bit line. The magnet memory device includes a memory cell array composing of a plurality of the aforementioned multi-bit magnetic memory cells in a stacked structure, wherein at least two of the magnetic memory units include a top memory unit and a bottom memory unit. The write word line is located between the top memory unit and the bottom memory unit and is used by both of them. The top write bit line is located above the top magnetic memory unit and the bottom write bit line is located below the bottom magnetic memory unit. A sense amplifier is connected to a read bit line for reading a total magneto-resistance value of a selected magnetic memory cell. Furthermore, the total magneto-resistance value is compared with a plurality of reference value to obtain the stored data.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
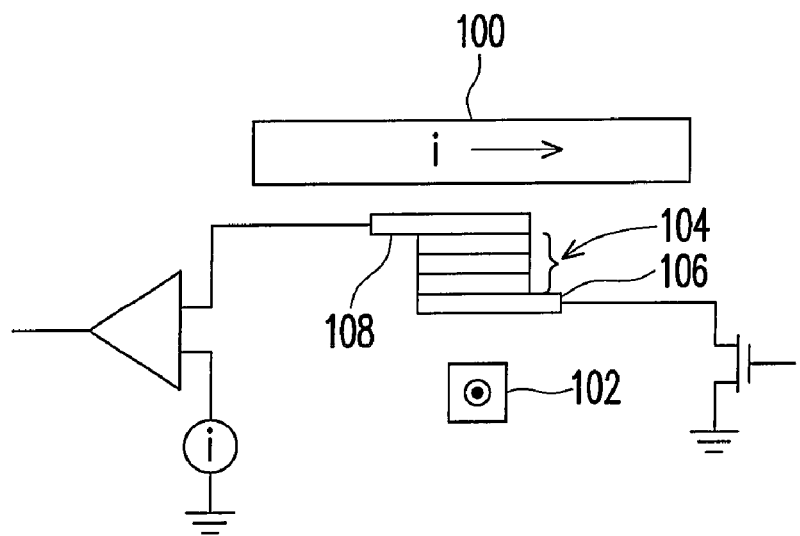
FIG. 1 is a diagram showing the basic structure of a conventional magnetic memory cell.

Reference will now be made in detail to the present preferred embodiments of the invention, examples of which are illustrated in the accompanying drawings. Wherever possible, the same reference numbers are used in the drawings and the description to refer to the same or like parts.

The present invention proposes stacking up magnetic memory units so that the magnetic memory structure has a higher density. The stacked memory cell units uses more than two magnetic memory units with different magneto-resistance characteristics and the magnetic memory units are electrically connected in parallel or in series so as to produce a multi-bit magnetic memory cell structure. Furthermore, the memory cells can be connected to a switching device, can have high density, high data transmission rate and high writing selectivity. The switching device is a reading transistor, for example. In addition, the magnetic memory units with different magneto-resistance characteristics can be manufactured through using tunnel barrier layer of different thickness in the fabrication process. In the following, a few embodiments are used to illustrate the present invention. However, the present invention is not limited to the embodiments provided.

Figure 2:
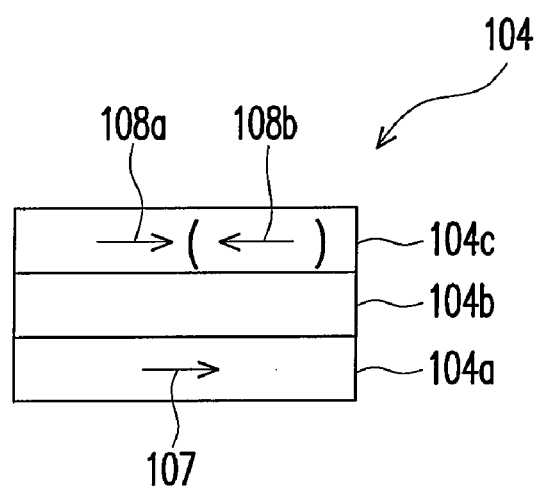
FIG. 2 shows a memory mechanism of a magnetic memory.
Figure 3:
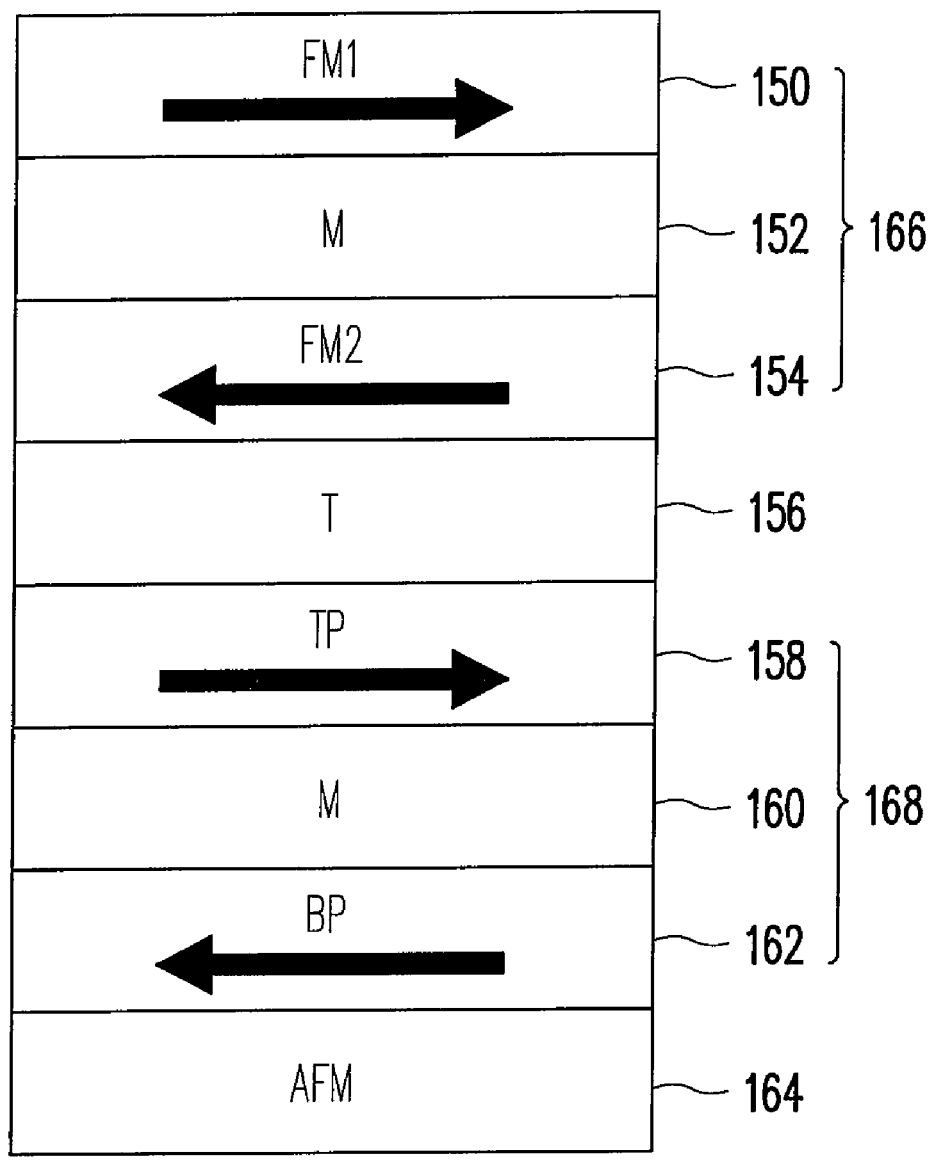
FIG. 3 is a diagram showing the cross-sectional view structure of a conventional magnetic memory cell.
Figure 4:
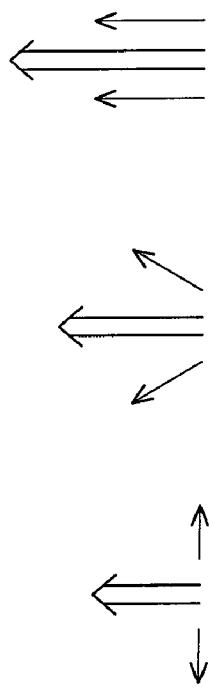
FIG. 4 is a diagram showing the effect of an external magnetic field on the stacked free layer.
Figure 5:
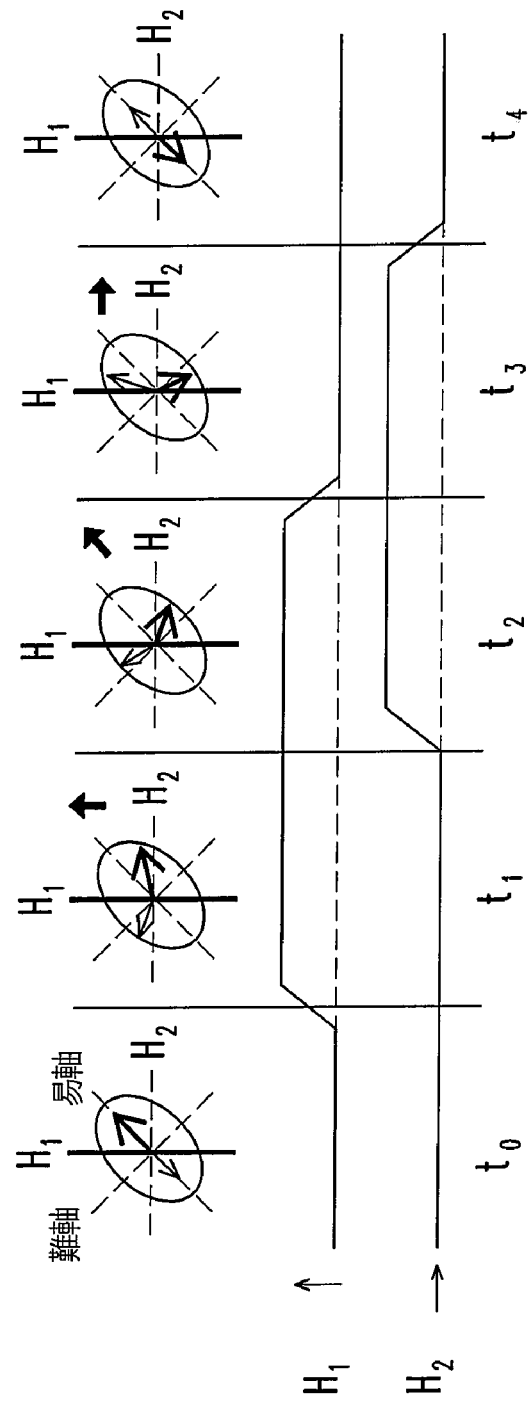
FIG. 5 is a timing diagram of external magnetic fields in the toggle mode.
Figure 10:
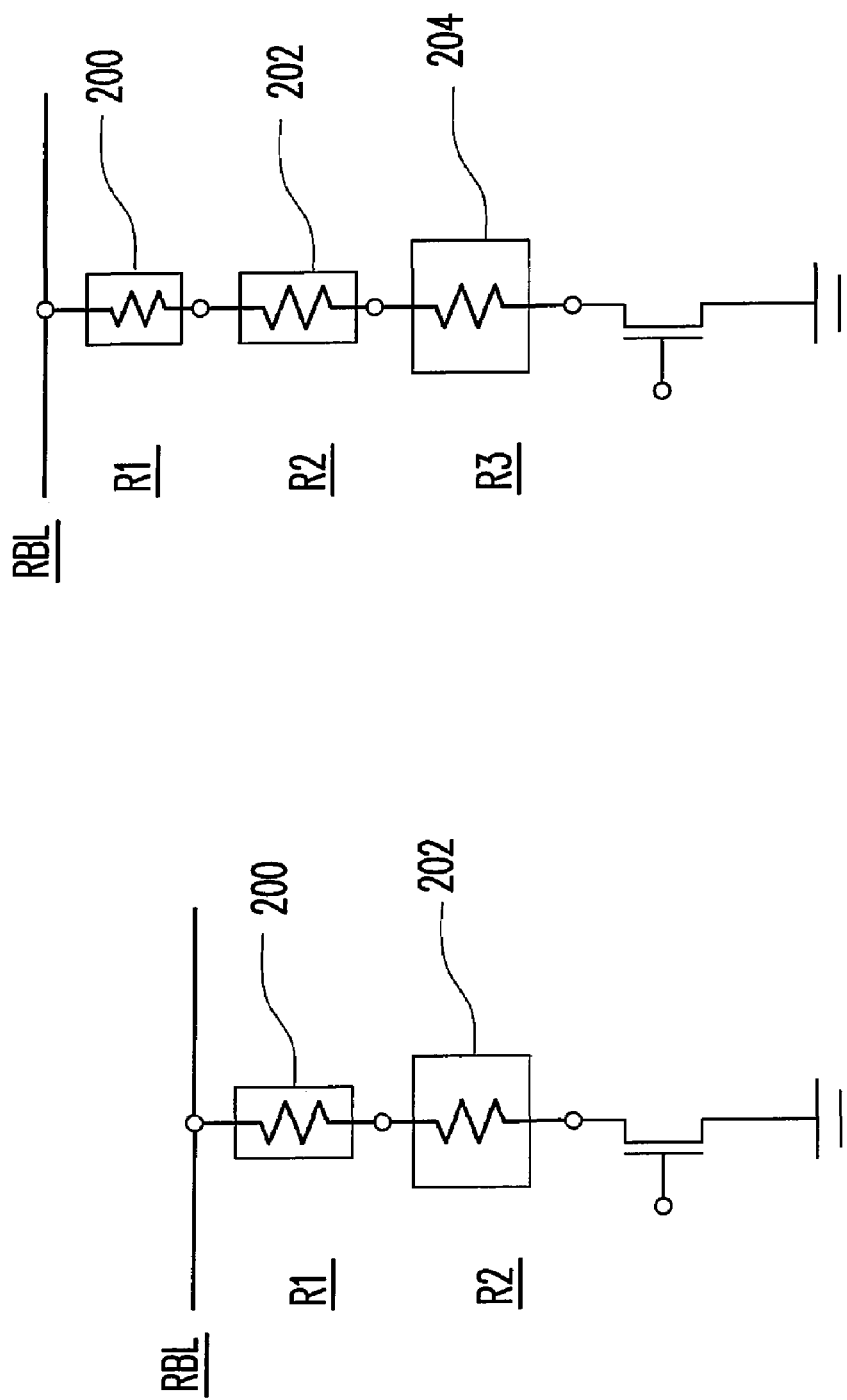
FIG. 10 is a diagram showing a multi-bit magnetic memory cell in a stacked structure according to an embodiment of the present invention.

FIG. 10 is a diagram showing a multi-bit magnetic memory cell in a stacked structure according to an embodiment of the present invention. As shown in FIG. 10, the multi-bit magnetic memory cell of the present invention is formed by using a plurality of magnetic memory units with different magneto-resistance and stacking the magnetic memory units vertically. The stacked structure looks like the one on the left side of FIG. 10, for example, and is formed by stacking two magnetic memory units 200 and 202. To facilitate description, the magnetic memory unit 200 can be referred to as the top memory unit 200 with a magneto-resistance R1, for example. Similarly, the magnetic memory unit 202 can be referred to as the bottom memory unit 202 with a magneto-resistance R2. Moreover, the magneto-resistance R1 is greater than the magneto-resistance R2, for example. However, the magneto-resistance R1 can also be smaller than the magneto-resistance R2. The important point is that R1 cannot be equal to R2. As described in FIG. 2, the magneto-resistance is determined by the thickness of the tunnel barrier layer 104b, for example. Yet, the directions of the magnetization 108a and 108b can produce a read-out magneto-resistance having a maximum value Rmax and a minimum value Rmin. Therefore, each of the two magnetic memory units 200 and 202 can correspond to a single bit and form a 2-bit storage unit. Using a serial connection as an example, by respectively controlling the direction of magnetization of the two magnetic memory units 200 and 202, the total magneto-resistance has four states including, for example, R1_max+R2_max, R1_max+R2_min, R1_min+R2_max, and R1_min+R2_min. When the field effect transistor is conducting and is connected to a ground voltage, the Read Bit Line (RBL) can read the total magneto-resistance.

Using the same principles, additional magnetic memory units may be added to the two magnetic memory units 200 and 202 to increase the number of bits per cell. For example, the multi-bit magnetic memory cell on the right side of FIG. 10 uses three magnetic memory units 200, 202 and 204 to form a 3-bit memory cell. The magnetic memory units 200, 202 and 204 have different magneto-resistance R1, R2 and R3, respectively. Moreover, additional magnetic memory units may be added in a similar way. Since the storage mechanism with additional magnetic memory units is similar to the storage mechanism of the stacked structure in the diagram on the left side of FIG. 10, a detailed description is not repeated.

Figure 11:
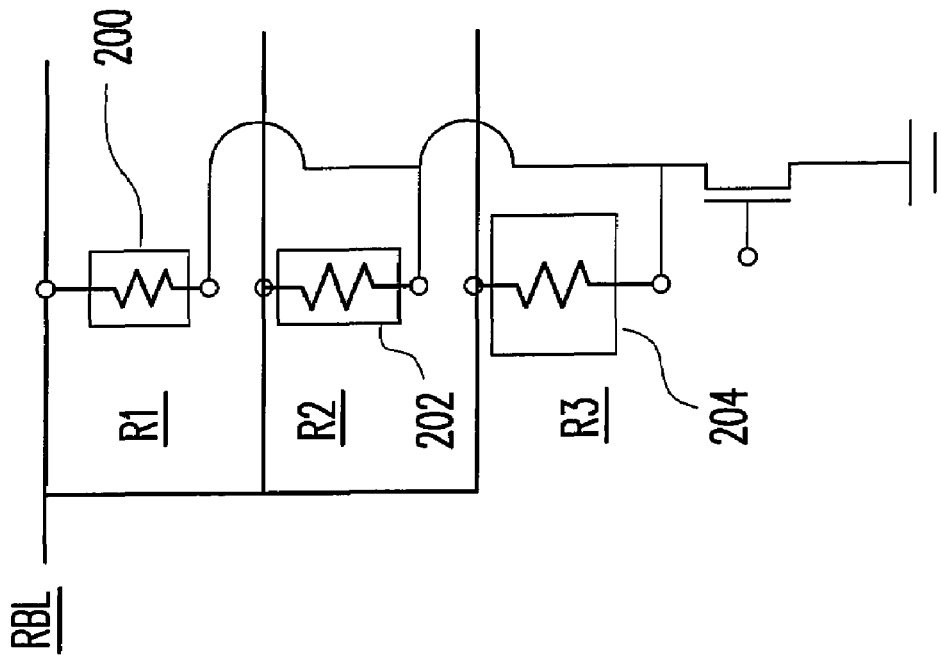
FIG. 11 is a diagram showing another multi-bit magnetic memory cell in a stacked structure according to an embodiment of the present invention.
Figure 11:
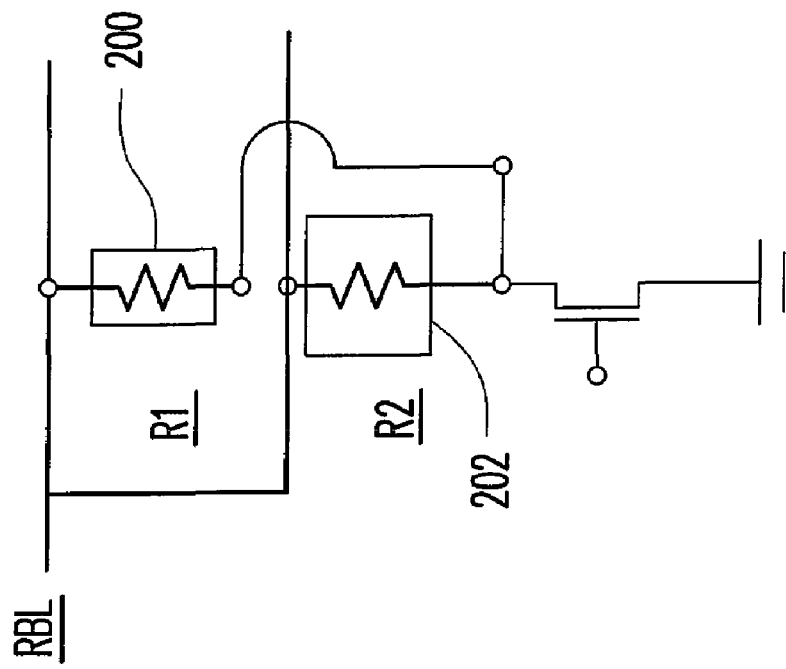

FIG. 11 is a diagram showing another multi-bit magnetic memory cell in a stacked structure according to an embodiment of the present invention. As shown in FIG. 11, the stacked structure is similar to the stacked structure in FIG. 10. However, the magnetic memory units are connected in parallel. The Read Bit Line (RBL) is divided into two branches for connecting with the two magnetic memory units 200 and 202, respectively. When the number of bits in the memory cell exceeds two, for example, like the 3-bit memory cell design shown on the right side of FIG. 11, the same mechanism is used. Because the magnetic memory units are connected in parallel, using the 2-bit memory cell as an example, the four states of the magneto-resistance are R1_max//R2_max, R1_max//R2_min, R1_min//R2_max and R1_min//R2_min, for example.

The stacked structural design of the present invention allows multi-bit magnetic memory cells to be fabricated as a memory device on an area that does not occupy too much of the horizontal dimension. As a result, the multi-bit magnetic memory cells can be used as memory device for producing a memory with a higher bit density so that substantial benefits are accrued to the overall cost of producing the memory device.

Figure 12:
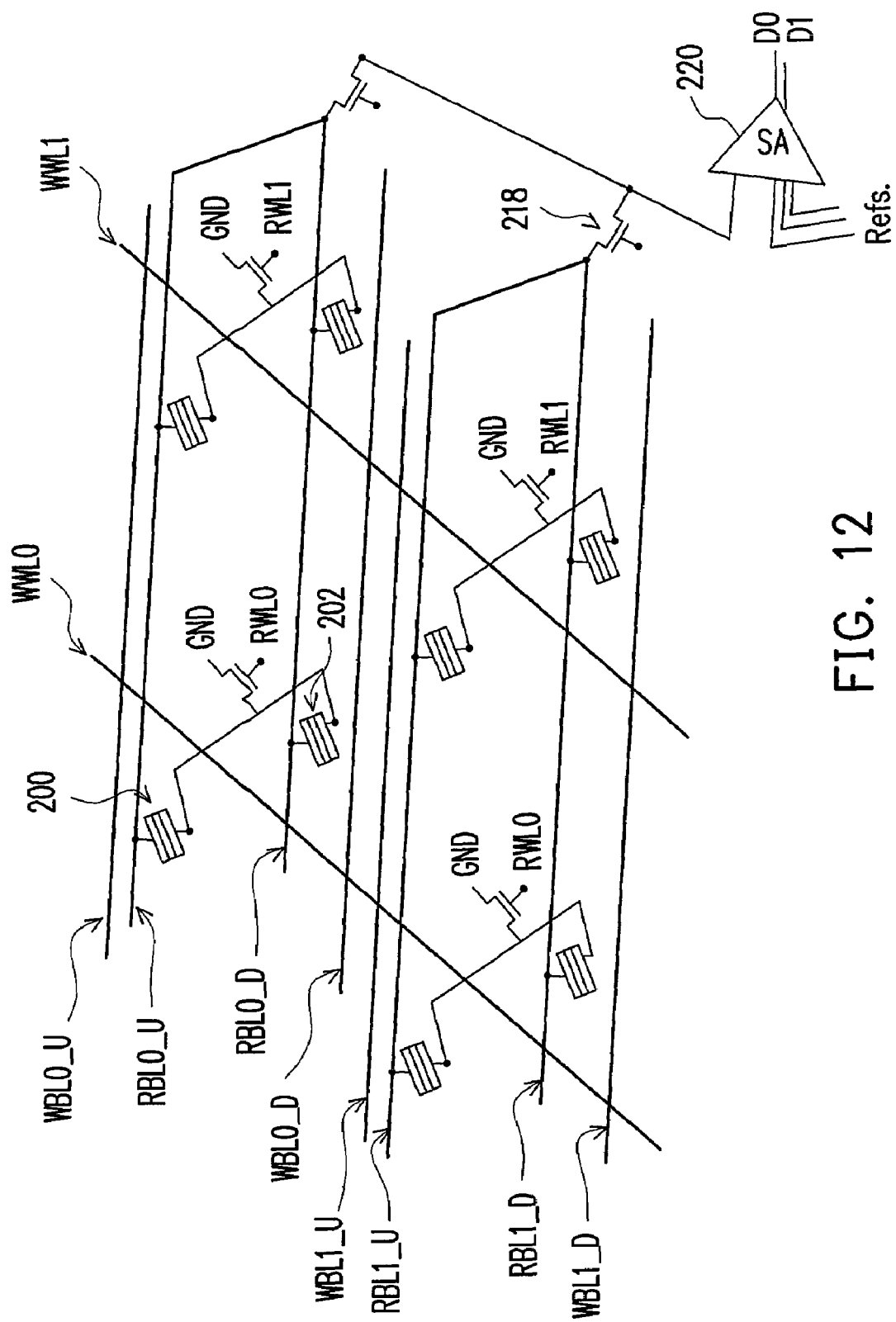
FIG. 12 is a perspective view showing a circuit layout of magnetic memory cells in parallel connection according to an embodiment of the present invention.

FIG. 12 is a perspective view showing a circuit layout of magnetic memory cells in parallel connection according to an embodiment of the present invention. As shown in FIG. 12, an array of four 2-bit magnetic memory cells is used as an example in the illustration below. One two-bit magnetic memory cell includes two stacked memory units 200 and 202. When these two magnetic memory units 200 and 202 operate in parallel, their cathode terminals are connected to a ground voltage GND through a switching device. The switching device is a field effect transistor whose gate is controlled by the Read Word Line (RWL), for example. The Read Word Line (RWL) can be divided into RWL0, RWL1 ... and so on according to the array relationship. The Read Bit Line (RBL) together with the parallel connection can be divided into a top Read Bit Line (RBL_U) and a bottom Read Bit Line (RBL_D). The anodes of the two magnetic memory units 200 and 202 are respectively connected to the top Read Bit Line (RBL0_U) and the bottom Read Bit Line (RBL0_D). The operation of controlling the magnetization of the free layer in the two magnetic memory units 200 and 202 so as to write in data can be achieved using the Write Bit Line (WBL) and the Write Word Line (WWL). Here, it should be noted that the word line and the bit line are only terms used in the description. In reality, the word line and the bit line are two conducting lines disposed perpendicular to each other so that operating magnetic fields are produced upon the passage of a current through the respective lines. It should be understood that each line is labeled with a number 0, 1, . . . and so on to distinguish one line from the other lines according to the row and column relationship of an array.

Because the two magnetic memory units 200 and 202 form a 2-bit memory cell, the Write Word Line (WWL) is disposed in the middle of the stacked structure. The Write Bit Line (WBL) can be divided into a top Write Bit Line (WBL_U) and a bottom Write Bit Line (WBL_D) respectively disposed above the top magnetic memory unit 200 and below the bottom magnetic memory unit 202. The operation of the first magnetic memory cell is controlled using the Write Bit Lines WBL0_U and WBL0_D and the Write Word Line WWL0, for example. To read data from the magnetic memory cell, the Read Word Line (RWL), for example, RWL0 corresponding to the selected magnetic memory cell makes the field effect transistor conducting so as to connect to the ground voltage GND. Meanwhile, the Read Bit Lines RBL0_U and RBL0_D read the magneto-resistance signal in parallel and the magneto-resistance signal is amplified by a sense amplifier 220. A switching transistor 218 is used for controlling the access of a sector of memory cells. Because two bits of data has four corresponding states, the sense amplifier 220 also receives a few reference signals, for example, 3 reference signals so as to detect the correct input state and output two bits of data D0 and D1.

Figure 13:
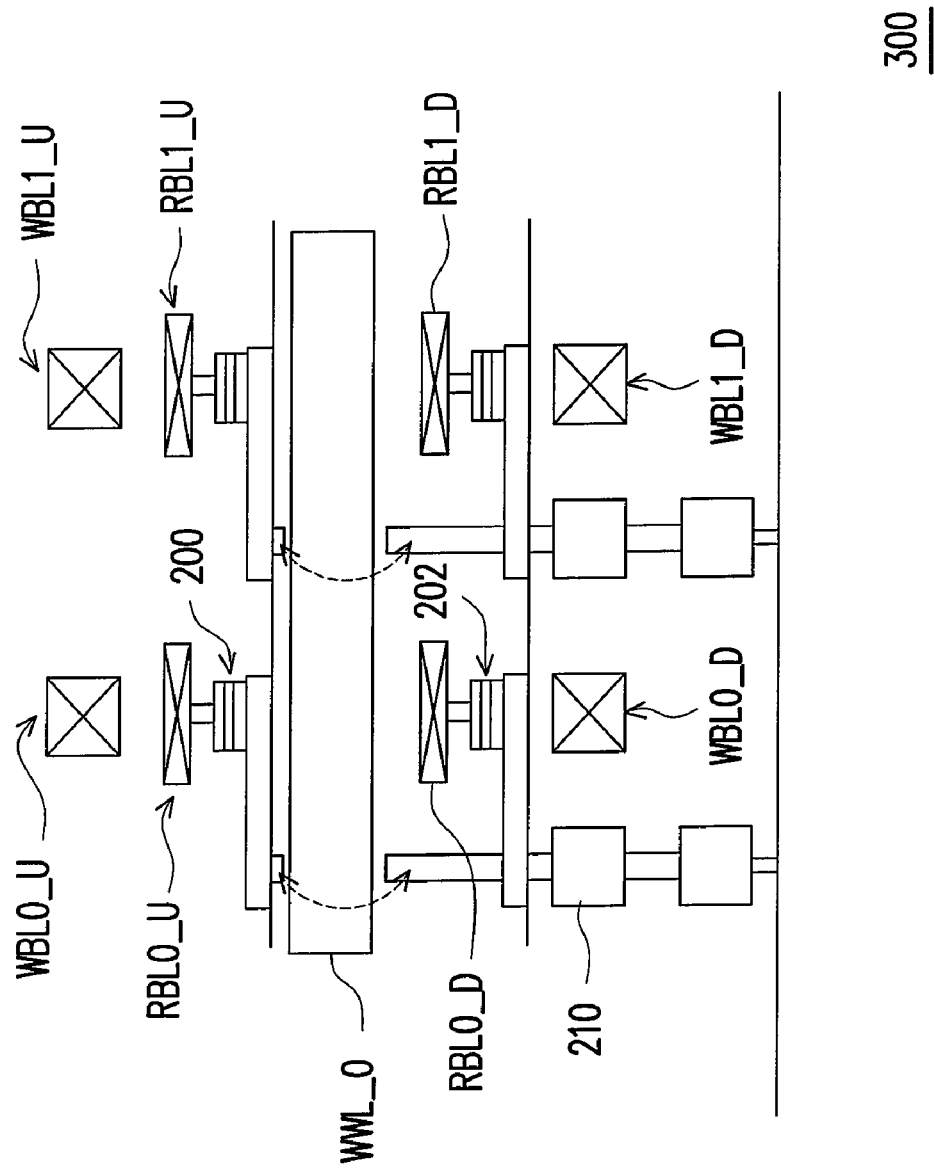
FIG. 13 is a schematic cross-sectional view of magnetic memory cells in parallel connection according to an embodiment of the present invention.

The circuit shown in FIG. 12 can be manufactured using conventional semiconductor techniques. FIG. 13 is a schematic cross-sectional view of magnetic memory cells in parallel connection according to an embodiment of the present invention. First, different inter-connecting circuit structures 210 are formed on a semiconductor substrate 300 and connected through via plug structures. Next, the magnetic memory units 200 and 202 are fabricated as a stacked structure. The Write Word Line WWL_0 extends horizontally between the top magnetic memory unit 200 and the bottom magnetic memory unit 202. Furthermore, the top Write Bit Line WBL0_U is located above the top magnetic memory unit 200 and the bottom Write Bit Line WBL0_D is located below the bottom magnetic memory unit 202. The top Write Bit Line WBL0_U and the bottom Write Bit Line WBL0_D are perpendicular to the Write Word Line WWL_0 and their directions of extension are labeled with an "X". The anode of the top magnetic memory unit 200 is connected to the top Read Bit Line RBL0_U through a via plug, and the anode of the bottom magnetic memory unit 202 is connected to the bottom Read Bit Line RBL0_D through another via plug. As shown in FIG. 12, the top Read Bit Line RBL0_U and the bottom Read Bit Line RBL0_D are also connected to the sense amplifier 220. On the other hand, the cathode of the top magnetic memory unit 200 and the bottom magnetic memory unit 202 are respectively connected to a reading switch and a ground voltage of the substrate 300 across the Write Word Line WWL_0 through a via plug (as shown in dashed arrow).

The structure shown in FIG. 13 is used only to describe the stacked structure of the present invention. Those skilled in the art should be knowledgeable about actual structural details and methods of fabricating micro control circuits, for example, using the semiconductor process to fabricate conductive layer structures such as via plugs and other devices. Therefore, a detailed description is omitted here.

Figure 14:
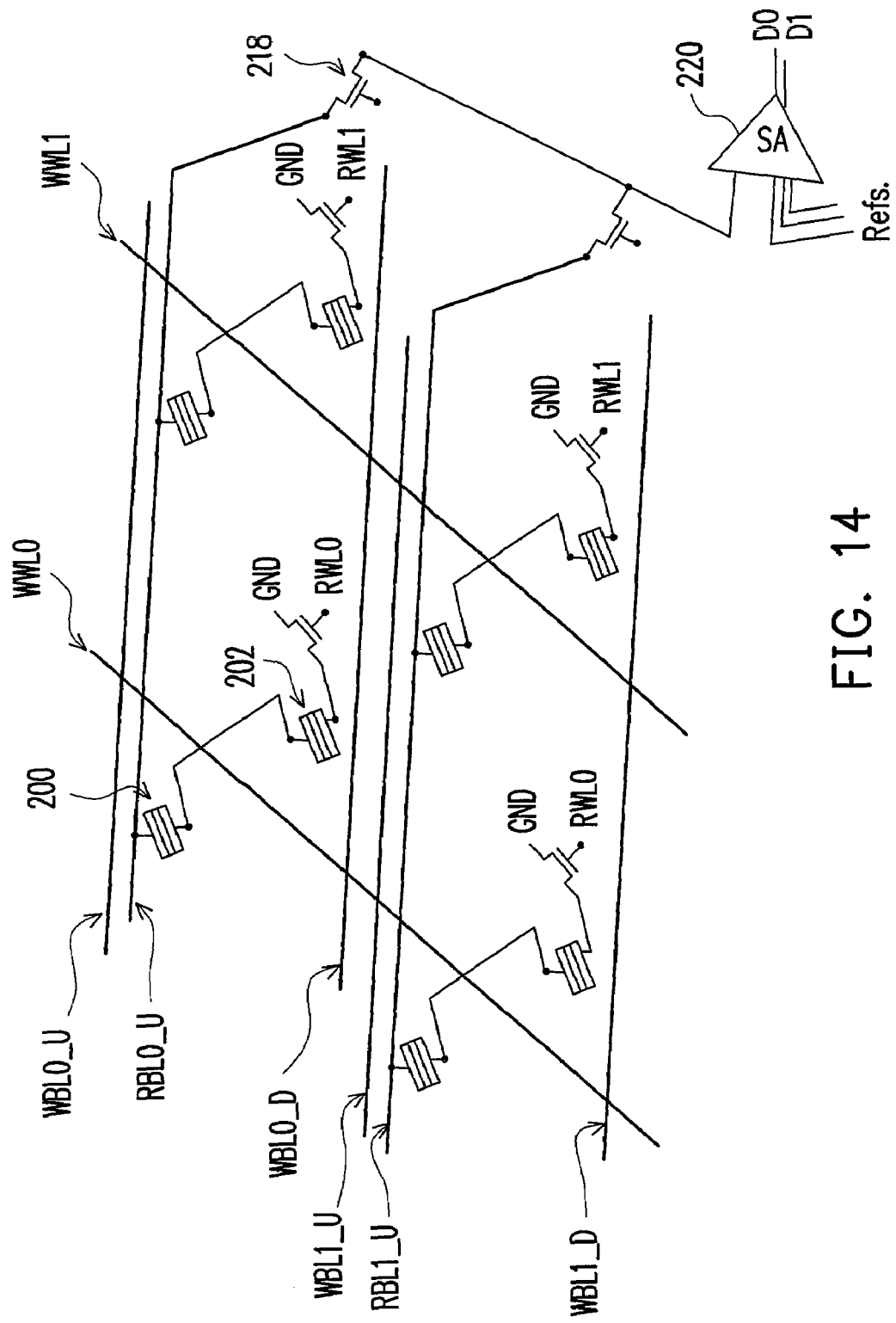
FIG. 14 is a perspective view showing a circuit layout of serial-connected magnetic memory cells according to an embodiment of the present invention.

FIG. 14 is a perspective view showing a circuit layout of serial-connected magnetic memory cells according to an embodiment of the present invention. By design, the magnetic memory units in FIG. 12 have a parallel connection while the magnetic memory units in FIG. 14 have connection in series, otherwise their basic structures are similar. The main difference is in their conducting line structure so that a serial connection is used instead of a parallel connection. In the serial connection, only the top Read Bit Line RBL0_U has to be retained for connecting with the sense amplifier 220. After the top magnetic memory unit 200 and the bottom magnetic memory unit 202 are serially connected, the cathode of the bottom magnetic memory unit 202 is connected to the ground voltage GND through the control of the Read Word Line RWL. The mechanism of writing of data into the magnetic memory cells is still identical to the previous embodiment.

Figure 6:
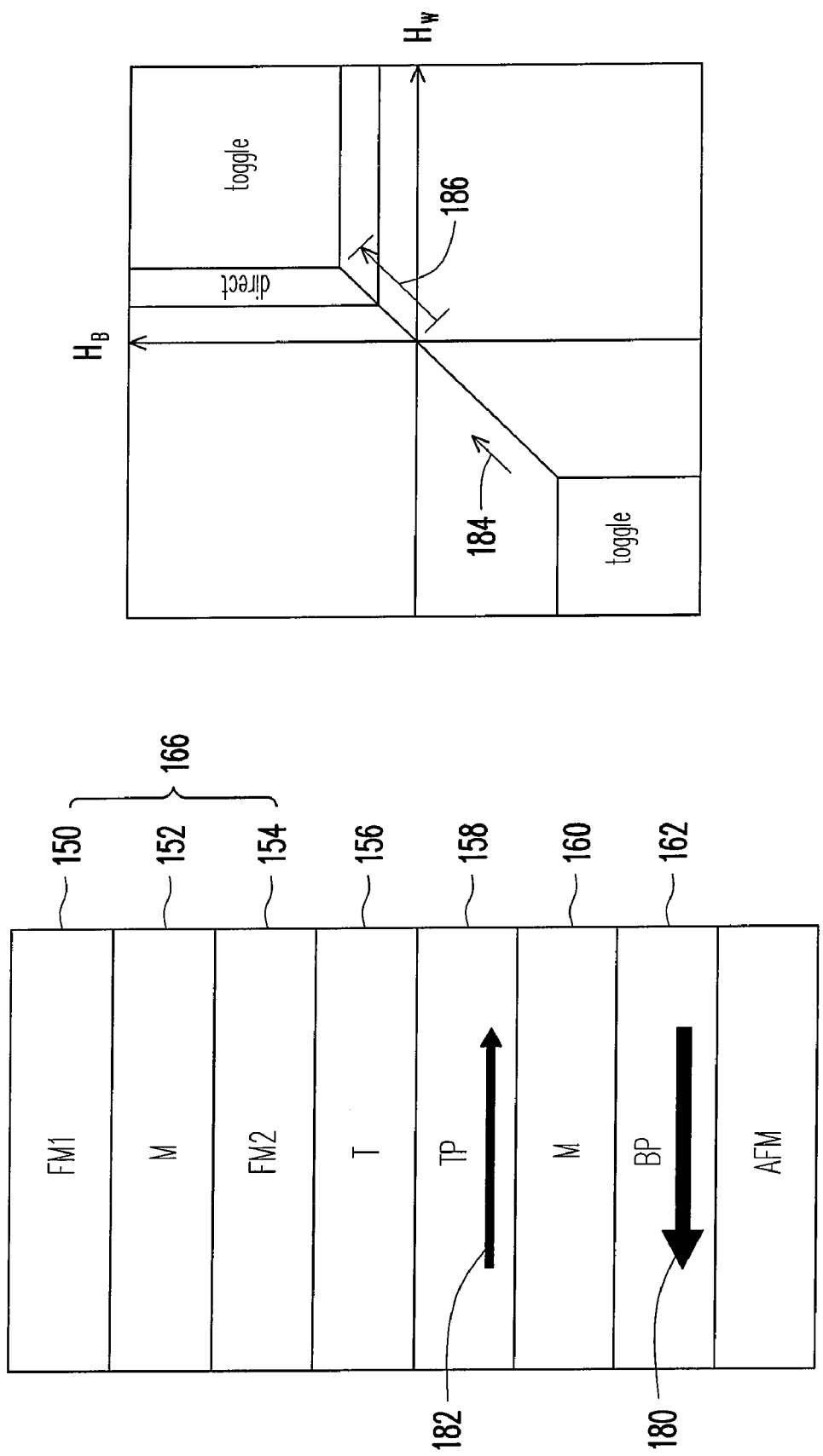
FIG. 6 is a diagram showing the conventional technique of reducing the operating current.
Figure 7:
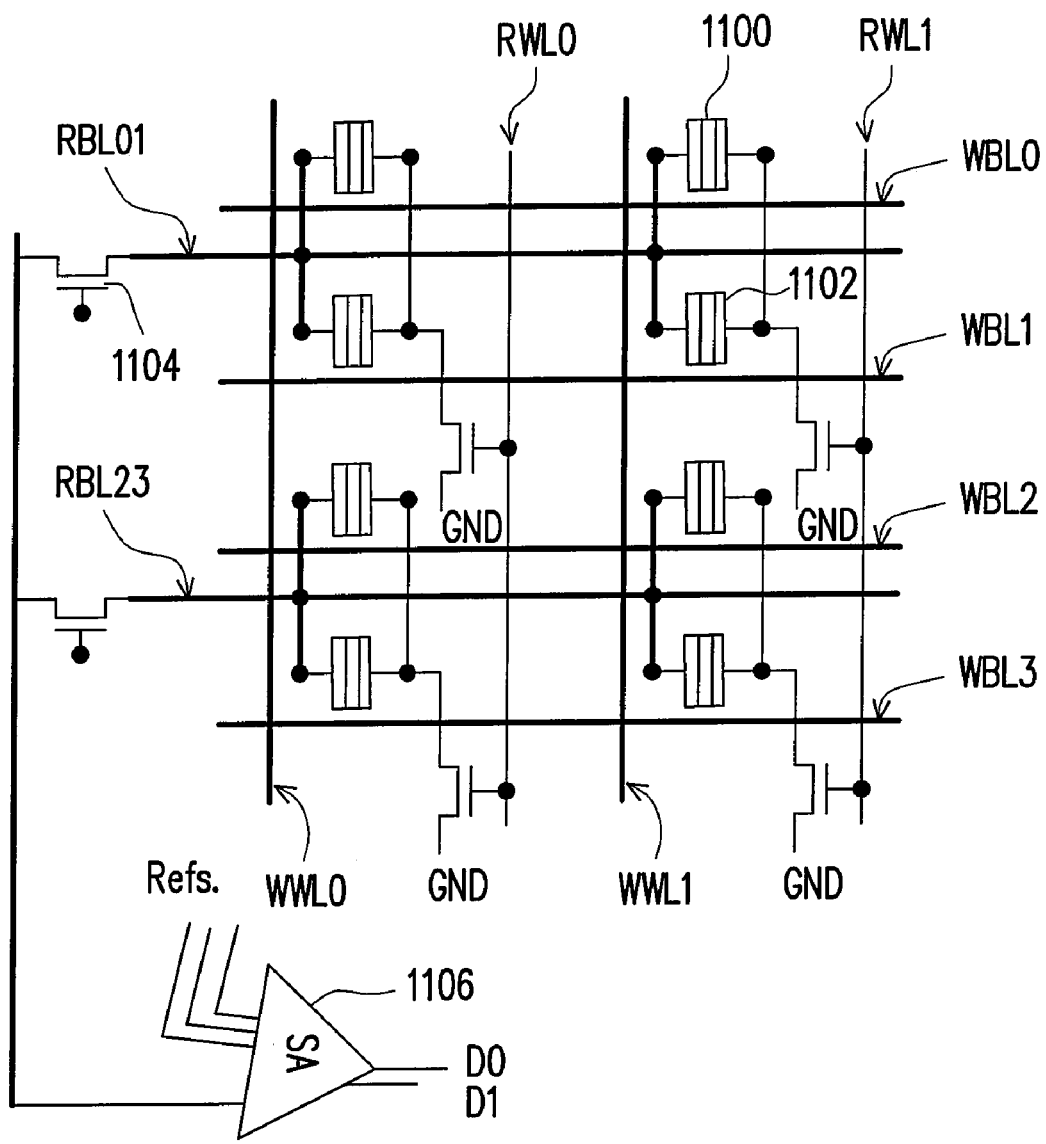
FIG. 7 shows the circuit structure of conventional two-bit memory cells in parallel connection.
Figure 8:
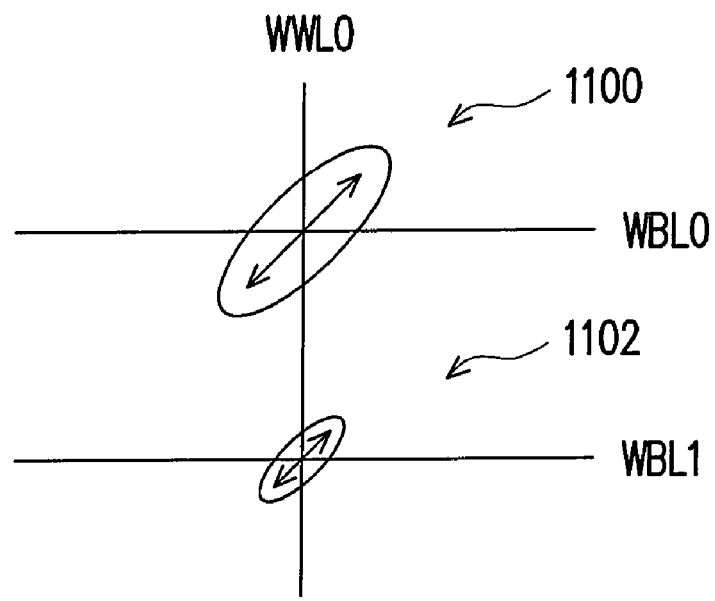
FIG. 8 is a diagram showing the mechanism of a conventional two-bit magnetic memory cell.
Figure 9:
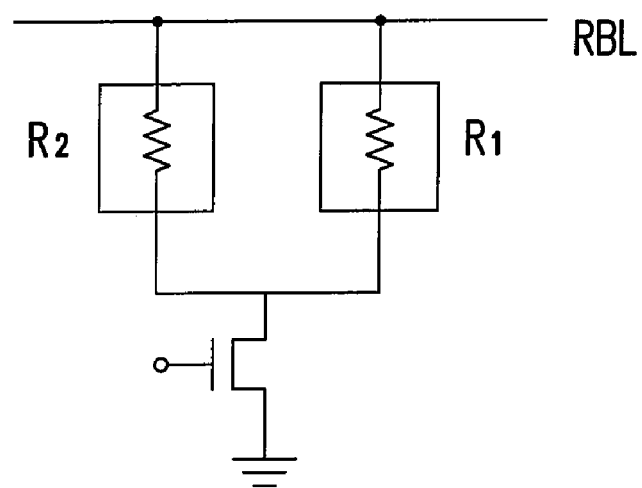
FIG. 9 is a circuit diagram of a conventional two-bit magnetic memory cell.

It should be noted that, as shown on the right side of FIG. 6, the write operation could be executed in the direct area or the toggle area (also known as the binary state area). The operation in the toggle area is more stable, but the operation in the direct area cannot be eliminated. There are slight differences in design between the two areas of operations.

Figures 15, 16, 17:
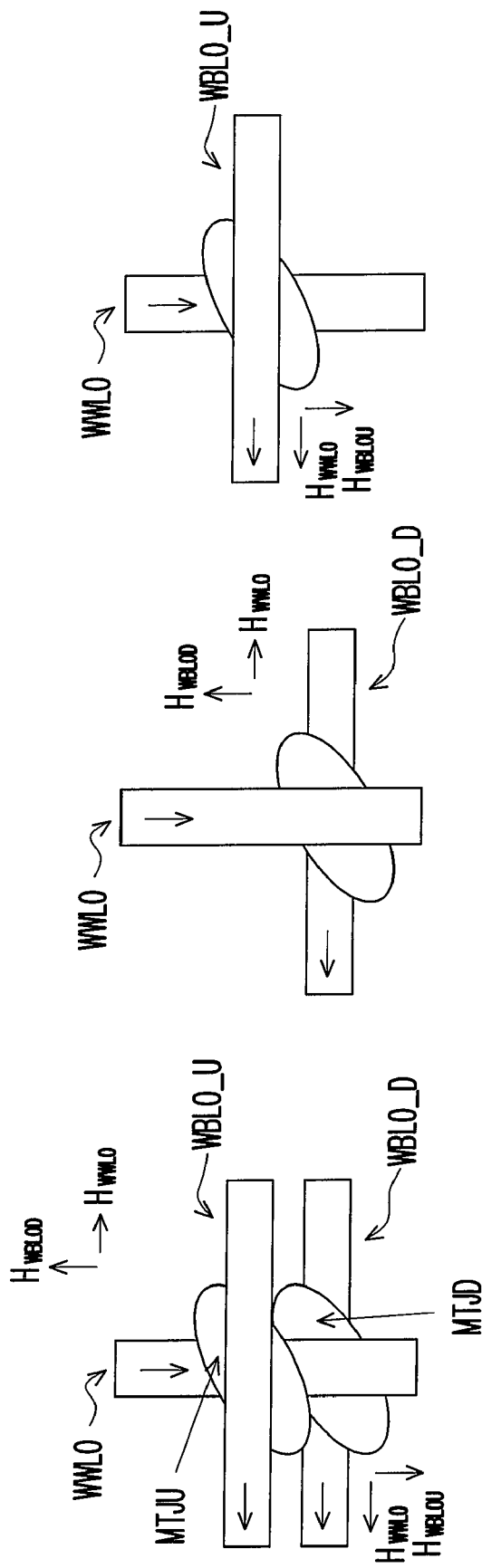
FIGS. 15-17 are diagrams showing a mechanism of writing in toggle mode according to an embodiment of the present invention.

First, the design of the toggle mechanism is described in more detail. FIGS. 15-17 are diagrams showing a mechanism of writing in toggle mode according to an embodiment of the present invention. As shown in FIG. 15, the top magnetic memory unit MTJU and the bottom magnetic memory unit MTJD both use the Write Word Line WWL0 between them. The Write Word Line WWL0 and the bottom Write Bit Line WBL0_D control the bottom magnetic memory unit MTJD as shown in FIG. 16. The Write Word Line WWL0 and the top Write Bit Line WBL0_U control the top magnetic memory unit MTJU as shown in FIG. 17. Currents are passed into the Write Word Line WWL0, the top Write Bit Line WBL0_U and the bottom Write Bit Line WBL0_D to produce magnetic fields. The direction of the magnetic fields and the direction of the currents are perpendicular to one another. For example, the bottom magnetic memory unit MTJD operates in the first quadrant limit (FIG. 16) and the top magnetic memory unit MTJU operates in the third quadrant limit (FIG. 17). However, this is not the only type of limitation:

Furthermore, a bias magnetic field such as the one shown in FIG. 6 can be added to the design of the toggle mode on demand.

Figure 18:
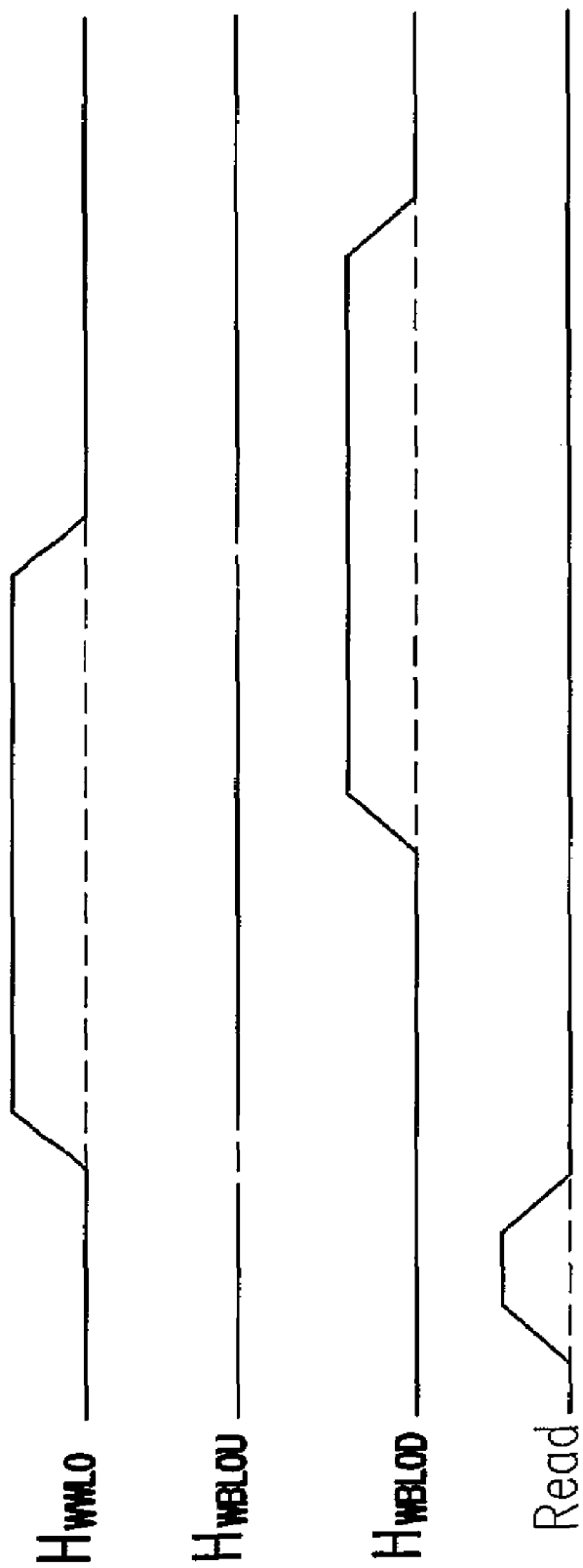
FIG. 18 is a diagram showing one of the operating waveforms of toggle mode according to an embodiment of the present invention.

FIG. 18 is a diagram showing one of the operating waveforms of toggle mode according to an embodiment of the present invention. As shown in FIG. 18, the content of the stored data is normally read before writing any data. The write operation is executed only when the data to be written is different from the data read-out form the magnetic memory cell. Therefore, when there is a need to write data, for example, there is a need to change the data in the bottom magnetic memory unit MTJD without changing the data in the top magnetic memory unit MTJU, a magnetic waveform $H_{WWL0}$ is input through their common Write Word Line WWL0 while the top Write Bit Line WBL0_U is maintained a unchanged low level magnetic waveform $H_{WBL0U}$. In this way, the data in the top magnetic memory unit MTJU will not be changed. Relatively speaking, inputting a magnetic waveform $H_{WBL0D}$ to the bottom Write Bit Line WBL0_D can form a waveform of the toggle operation and lead to a flip over of the magnetization of the bottom magnetic memory unit MTJD. According to the same principles, suitable waveforms can be input to change the bottom magnetic memory unit MTJD and the top magnetic memory unit MTJU simultaneously, or change the top magnetic memory unit MTJU without changing the bottom magnetic memory unit MTJD, or produce no change to both the top magnetic memory unit MTJU and the bottom magnetic memory unit MTJD.

Figure 19:
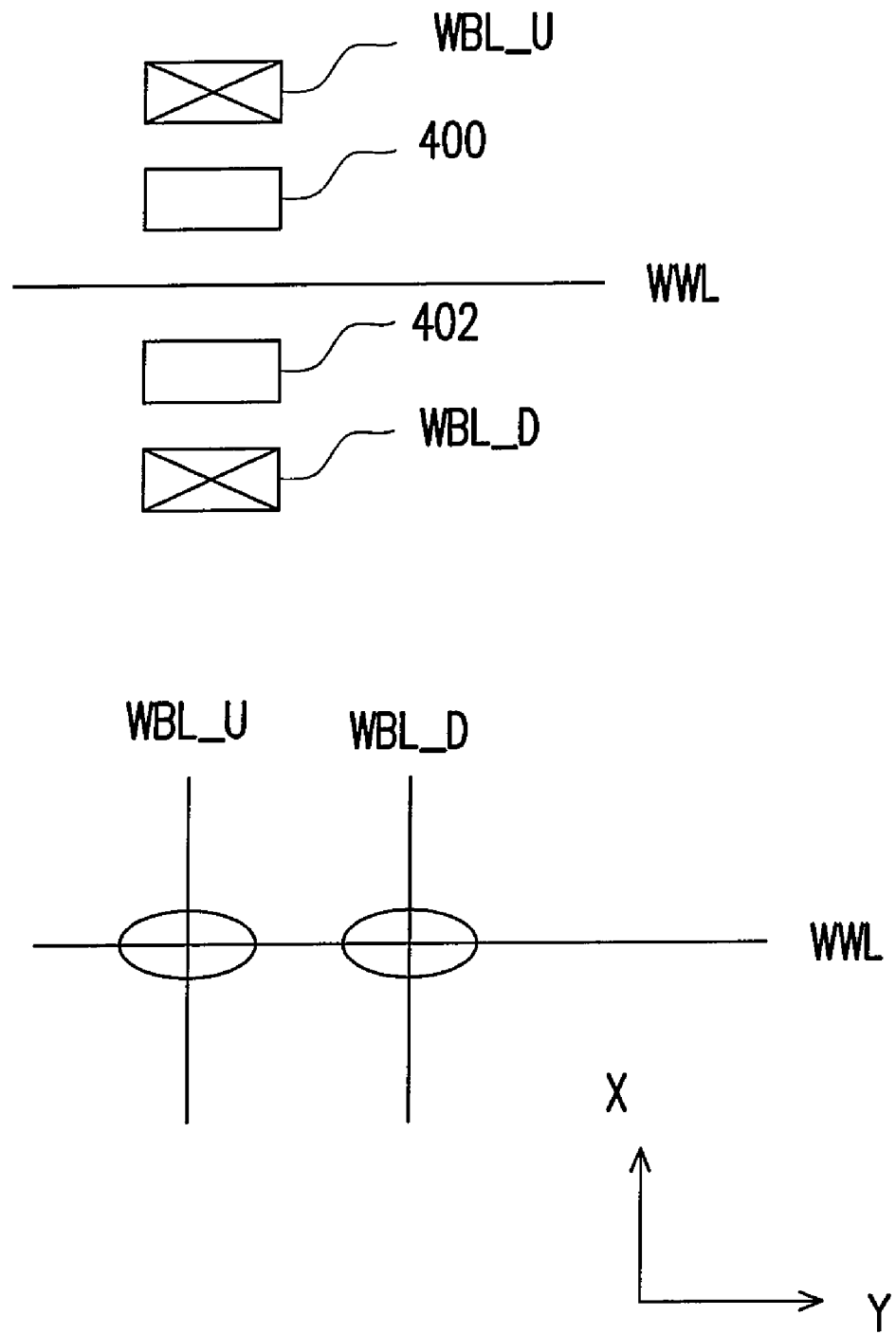
FIG. 19 is a diagram showing a mechanism of writing in direct mode according to an embodiment of the present invention.

FIG. 19 is a diagram showing a mechanism of writing in direct mode according to an embodiment of the present invention. Because the direction of magnetization is flipped over by the application of just one magnetic field in a direct mode of operation, there is no need to pre-offset the magnetization of the memory cell by 45° and has a direction of extension identical to the Write Word Line WWL (see the diagram below), for example. The stacked structure of the top magnetic memory unit 400 and the bottom magnetic memory unit 402 still remains. At this time, the Write Word Line WWL is still a common line and is used respectively with the top Write Bit Line WBL_U and the bottom Write Bit Line WBL_D to control the flip over of the magnetization in the Y direction.

Although a 2-bit magnetic memory cell is used as an example in the foregoing description, the same principles can be applied to design magnetic memory cells with more bits per cell.

In summary, the multi-bit magnetic memory cell structure in the present invention is capable of providing a higher memory storage density. At the same time, the operation is simplified by using the Write Word Line WWL as a common line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-bit magnetic memory cell in a stacked structure controlled by at least a read bit line and a read word line, comprising:
    at least two magnetic memory units, wherein each one of the at least two magnetic memory units respectively has a magneto-resistance value and the at least two magnetic memory units are in a stacked structure and connected in parallel or in series to form a circuit, and the circuit is connected to the read bit line; and
    a switching device electrically connected to the circuit, wherein the switching device is controlled by the read word line to be conducting or non-conducting so as to connect the circuit to a ground voltage,
    wherein a stored data corresponds to a total magneto-resistance value state of the circuit formed by the magnetic memory units with the magneto-resistance value of each magnetic memory unit capable of switching between two stable states,
    wherein the read bit line is divided into a plurality of branch lines for connecting with the respective magnetic memory units when the circuit is a parallel connection, wherein the read bit line is connected to the magnetic memory units in serial connection when the circuit is a serial connection.

2. The multi-bit magnetic memory cell in a stacked structure according to claim 1, wherein the magneto-resistance value is determined by a thickness of a tunnel barrier layer in each magnetic memory unit.

3. The multi-bit magnetic memory cell in a stacked structure according to claim 1, wherein the at least two magnetic memory units access data in a direct mode of operation.

4. The multi-bit magnetic memory cell in a stacked structure according to claim 1, wherein the at least two magnetic memory units access data in a toggle mode of operation.

5. The multi-bit magnetic memory cell in a stacked structure according to claim 1, wherein each magnetic memory unit comprises a bias magnetic field.

6. The multi-bit magnetic memory cell in a stacked structure according to claim 1, wherein the switching device comprises a field effect transistor.

7. A magnetic memory device controlled by lines including a write word line, a top write bit line and a bottom write bit line, comprising: a memory cell array, comprising a plurality of the multi-bit magnetic memory cells in a stacked structure according to claim 1, wherein the at least two magnetic memory units comprises a top magnetic memory unit and a bottom magnetic memory unit, the write word line is located between the top magnetic memory unit and the bottom magnetic memory unit and is commonly used by both the top and the bottom magnetic memory units, the top write bit line is located above the top magnetic memory unit and the bottom write bit line is located below the bottom magnetic memory unit; and
    a sense amplifier, connected to a read bit line for reading a total magneto-resistance value state from a selected magnetic memory cell and comparing with a plurality of reference values so as to obtain a stored data.

8. The magnetic memory device according to claim 7, wherein a stored data corresponds to a total magneto-resistance value state of the circuit formed by the magnetic memory units with the magneto-resistance value of each magnetic memory unit capable of switching between two stable states.

9. The magnetic memory device according to claim 8, wherein the magneto-resistance value is determined by a thickness of a tunnel barrier layer in each magnetic memory unit.

10. The magnetic memory device according to claim 7, wherein the at least two magnetic memory units access data in a direct mode of operation.

11. The magnetic memory device according to claim 7, wherein the at least two magnetic memory units access data in a toggle mode of operation.

12. The magnetic memory device according to claim 7, wherein each magnetic memory unit comprises a bias magnetic field.

13. The magnetic memory device according to claim 7, wherein the switching device comprises a field effect transistor.

14. The multi-bit magnetic memory cell in a stacked structure according to claim 1, wherein the magneto-resistance values of the magnetic memory units are all different.

* * * * *